US009148095B2

(12) United States Patent
Won et al.

(10) Patent No.: US 9,148,095 B2
(45) Date of Patent: Sep. 29, 2015

(54) BIAS CIRCUIT AND AMPLIFIER CONTROLLING BIAS VOLTAGE

(71) Applicant: SAMSUNG ELECTRO-MECHANICS CO., LTD., Suwon, Gyunggi-do (KR)

(72) Inventors: Jun Goo Won, Gyunggi-do (KR); Ki Joong Kim, Gyunggi-do (KR); Myeong Woo Han, Gyunggi-do (KR); Shinichi Iizuka, Gyunggi-do (KR); Ju Young Park, Gyunggi-do (KR); Youn Suk Kim, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 75 days.

(21) Appl. No.: 13/950,906

(22) Filed: Jul. 25, 2013

(65) Prior Publication Data
US 2014/0240049 A1  Aug. 28, 2014

(30) Foreign Application Priority Data

Feb. 28, 2013 (KR) ......................... 10-2013-0022249

(51) Int. Cl.
*H03F 3/19*  (2006.01)
*H03F 1/02*  (2006.01)
*H03F 1/56*  (2006.01)
*H03F 3/24*  (2006.01)

(52) U.S. Cl.
CPC ................ *H03F 3/19* (2013.01); *H03F 1/0272* (2013.01); *H03F 1/56* (2013.01); *H03F 3/245* (2013.01); *H03F 2200/222* (2013.01); *H03F 2200/387* (2013.01); *H03F 2200/555* (2013.01); *H03F 2200/78* (2013.01)

(58) Field of Classification Search
CPC .................... H03F 2200/468; H03F 2200/555
USPC ................................... 330/136, 285, 289, 296
See application file for complete search history.

(56) References Cited

U.S. PATENT DOCUMENTS

| 8,680,921 B2 * | 3/2014 | Honda et al. .................. 330/136 |
| 2007/0236293 A1 | 10/2007 | Masuda et al. |
| 2009/0212863 A1 | 8/2009 | Ishimaru |

FOREIGN PATENT DOCUMENTS

| JP | 2007-306543 A | 11/2007 |
| JP | 2009-200770 A | 9/2009 |

OTHER PUBLICATIONS

Oka, et al., "A High-Power Low-Distortion GaAs HBT Power Amplifier for Mobile Terminals Used in Broadband Wireless Applications," IEEE Journal of Solid-State Circuits, vol. 42, No. 10, Oct. 2007.

* cited by examiner

*Primary Examiner* — Steven J Mottola
(74) *Attorney, Agent, or Firm* — NSIP Law

(57) ABSTRACT

There are provided a bias circuit and an amplifier controlling a bias voltage, the bias circuit and the amplifier including a control voltage generating unit generating a control voltage using a reference voltage, a bias voltage generating unit generating a bias voltage according to the control voltage, and a voltage drop unit dropping the bias voltage from the bias voltage generating unit to a base voltage so as to provide the base voltage to an amplifying unit, wherein the control voltage generating unit controls the control voltage according to an amplitude of a high-frequency signal input to the amplifying unit.

13 Claims, 9 Drawing Sheets

BIAS CIRCUIT AND AMPLIFIER CONTROLLING BIAS VOLTAGE

CROSS-REFERENCE TO RELATED APPLICATIONS

This application claims the priority of Korean Patent Application No. 10-2013-0022249 filed on Feb. 28, 2013, in the Korean Intellectual Property Office, the disclosure of which is incorporated herein by reference.

BACKGROUND OF THE INVENTION

1. Field of the Invention

The present invention relates to a bias circuit and an amplifier capable of controlling a bias voltage according to the amplitude of a high-frequency signal input thereto.

2. Description of the Related Art

In general, a digital modulation/demodulation scheme has been selected as a wireless communications scheme, and appropriate schemes have been employed in consideration of frequency utilization efficiency. For instance, a quadrature phase shift keying (QPSK) scheme is employed for mobile telephones using a code division multiple access (CDMA) scheme, while an orthogonal frequency division multiplexing (QFDM) scheme is employed in a wireless LAN conforming to the Institute of Electrical and Electronics Engineers (IEEE) 802.11 standard.

Wireless communications systems in which such wireless communications schemes are employed include power amplifiers for amplifying high-frequency signals.

Here, in a system requiring linear amplification, a power amplifier having linear characteristics for amplifying a transmission signal without distortion is needed. Here, linear characteristics means that the power of an output signal is amplified at a constant rate while the phase thereof is not changed, even in the case that the power of an input signal varies.

In addition, a technology which compensates for temperature so as to prevent a power amplification rate from being significantly changed, even if an ambient temperature changes, is required.

In an existing power amplifier, a bias voltage generated by a bias circuit is supplied to a power amplifying element. The bias circuit may include a temperature compensation function.

In the existing power amplifier, a bias voltage and a bias current are provided to the base of an amplifying transistor included in an amplifying circuit so as to amplify a high-frequency signal input thereto.

Although the existing power amplifier has a temperature compensation function using a transistor included in the bias circuit, the temperature compensation function thereof may also be limited, such that the bias current may increase as temperature increases. In this case, the increased bias current may in turn cause the temperature at the junction of the transistor included in the bias circuit to be increased, such that the so-called "thermal runaway" phenomenon may occur.

In order to overcome this shortcoming, a current limiting resistor for limiting the bias current may be provided between the current supplying terminal of the bias circuit and the base of the amplifying transistor.

However, in the existing power amplifier, when a high-frequency signal having a higher amplitude than a normal amplitude is input thereto, the bias current increases according to the characteristics of the amplifying transistor. As the bias current increases, the voltage drop across the current limiting resistor is increased, such that the voltage supplied to the base of the amplifying transistor may be reduced.

As described above, when a high-frequency signal having a relatively large amplitude is input, the bias voltage supplied to the base of the amplifying transistor may be reduced, such that a linear region in which the amplifying transistor may perform amplification without distortion is narrowed. As a result, the high-frequency signal having a large amplitude may be distorted.

Patent Document 1 referenced below relates to a power amplifier but does not teach controlling a bias voltage according to the amplitude of a high-frequency signal.

RELATED ART DOCUMENT (Patent Document 1) Japanese Patent Laid-Open Publication No. 2009-200770

SUMMARY OF THE INVENTION

An aspect of the present invention provides a bias circuit and an amplifier capable of controlling a bias voltage according to an amplitude of a high-frequency signal input thereto.

According to an aspect of the present invention, there is provided a bias circuit, including: a control voltage generating unit generating a control voltage using a reference voltage; a bias voltage generating unit generating a bias voltage according to the control voltage; and a voltage drop unit dropping the bias voltage from the bias voltage generating unit to a base voltage so as to provide the base voltage to an amplifying unit, wherein the control voltage generating unit controls the control voltage according to an amplitude of a high-frequency signal input to the amplifying unit.

The control voltage generating unit may include a variable resistance circuit having a resistance value varied depending on a mode voltage determined according to the amplitude of the high-frequency signal, and the variable resistance circuit may control the control voltage according to the varied resistance value.

The control voltage generating unit may include: a variable collector resistor circuit unit having one terminal connected to an input terminal of the reference voltage and the other terminal, and having a resistance value varied depending on a mode voltage determined according to the amplitude of the high-frequency signal; a first temperature compensation transistor having a collector connected to the other terminal of the variable collector resistor circuit unit and an emitter and a base connected to a ground; a second temperature compensation transistor having a collector connected to an input terminal of an operating voltage, a base connected to the collector of the first temperature compensation transistor, and an emitter connected to the base of the first temperature compensation transistor; and an emitter resistor connected between the emitter of the second temperature compensation transistor and the ground, and the control voltage output from the collector of the first temperature compensation transistor may be controlled according to the resistance value varied in the variable collector resistor circuit unit.

The control voltage generating unit may include: a collector resistor having one terminal connected to an input terminal of the reference voltage and the other terminal; a first temperature compensation transistor having a collector connected to the other terminal of the collector resistor and an emitter and a base connected to a ground; a second temperature compensation transistor having a collector connected to an input terminal of an operating voltage, a base connected to the collector of the first temperature compensation transistor, and an emitter connected to the base of the first temperature compensation transistor; and a variable emitter resistor circuit unit connected between the emitter of the second temperature compensation transistor and the ground, and having a resistance value varied depending on a mode voltage determined according to the amplitude of the high-frequency signal, and the control voltage output from the collector of the first temperature compensation transistor may be controlled according to the resistance value varied in the variable emitter resistor circuit unit.

The control voltage generating unit may include: a variable collector resistor circuit unit having one terminal connected to an input terminal of the reference voltage and the other terminal, and having a resistance value varied depending on a mode voltage determined according to the amplitude of the high-frequency signal; a first temperature compensation transistor having a collector connected to the other terminal of the variable collector resistor circuit unit and an emitter and a base connected to a ground; a second temperature compensation transistor having a collector connected to an input terminal of an operating voltage, a base connected to the collector of the first temperature compensation transistor, and an emitter connected to the base of the first temperature compensation transistor; and a variable emitter resistor circuit unit connected between the emitter of the second temperature compensation transistor and the ground, and having a resistance value varied depending on a mode voltage determined according to the amplitude of the high-frequency signal, and the control voltage output from the collector of the first temperature compensation transistor may be controlled according to the resistance value varied in each of the variable collector resistor circuit unit and the variable emitter resistor circuit unit.

According to another aspect of the present invention, there is provided an amplifier, including: an amplifying unit amplifying a high-frequency signal; a control voltage generating unit generating a control voltage using a reference voltage, the control voltage being controlled depending on a mode voltage; a bias voltage generating unit generating a bias voltage according to the control voltage; a voltage drop unit dropping the bias voltage from the bias voltage generating unit to a base voltage so as to provide the base voltage to the amplifying unit; and a control unit determining the mode voltage according to the amplitude of the high-frequency signal so as to provide the mode voltage to the control voltage generating unit.

The control voltage generating unit may include a variable resistance circuit having a resistance value varied depending on the mode voltage and the variable resistance circuit may control the control voltage according to the varied resistance value.

The control voltage generating unit may include: a variable collector resistor circuit unit having one terminal connected to an input terminal of the reference voltage and the other terminal, and having a resistance value varied depending on the mode voltage; a first temperature compensation transistor having a collector connected to the other terminal of the variable collector resistor circuit unit and an emitter and a base connected to a ground; a second temperature compensation transistor having a collector connected to an input terminal of an operating voltage, a base connected to the collector of the first temperature compensation transistor, and an emitter connected to the base of the first temperature compensation transistor; and an emitter resistor connected between the emitter of the second temperature compensation transistor and the ground, and the control voltage output from the collector of the first temperature compensation transistor may be controlled according to the resistance value varied in the variable collector resistor circuit unit.

The control voltage generating unit may include: a collector resistor having one terminal connected to an input terminal of the reference voltage and the other terminal; a first temperature compensation transistor having a collector connected to the other terminal of the collector resistor and an emitter and a base connected to a ground; a second temperature compensation transistor having a collector connected to an input terminal of an operating voltage, a base connected to the collector of the first temperature compensation transistor, and an emitter connected to the base of the first temperature compensation transistor; and a variable emitter resistor circuit unit connected between the emitter of the second temperature compensation transistor and the ground, and having a resistance value varied depending on the mode voltage, and the control voltage output from the collector of the first temperature compensation transistor may be controlled according to the resistance value varied in the variable emitter resistor circuit unit.

The control voltage generating unit may include: a variable collector resistor circuit unit having one terminal connected to an input terminal of the reference voltage and the other terminal, and having a resistance value varied depending on a mode voltage; a first temperature compensation transistor having a collector connected to the other terminal of the variable collector resistor circuit unit and an emitter and a base connected to a ground; a second temperature compensation transistor having a collector connected to an input terminal of an operating voltage, a base connected to the collector of the first temperature compensation transistor, and an emitter connected to the base of the first temperature compensation transistor; and a variable emitter resistor circuit unit connected between the emitter of the second temperature compensation transistor and the ground, and having a resistance value varied depending on the mode voltage, and the control voltage output from the collector of the first temperature compensation transistor may be controlled according to the resistance value varied in each of the variable collector resistor circuit unit and in the variable emitter resistor circuit unit.

The variable collector resistor circuit unit may include: a plurality of resistors connected in series between the one terminal and the other terminal thereof; and a first semiconductor switch element connected to at least one of the plurality of resistors in parallel and turned on or off depending on the mode voltage.

The variable emitter resistor circuit unit may include: a plurality of resistors connected in series between the emitter of the second temperature compensation transistor and the ground; and a second semiconductor switch element connected to at least one of the plurality of resistors in parallel and turned on or off depending on the mode voltage.

The bias voltage generating unit may include: a bias supplying transistor having a collector connected to an input terminal of an operating voltage, a base connected to the collector of the first temperature compensating transistor, and an emitter connected to an output node of the bias voltage generating unit; and a capacitor connected between the base of the bias supplying transistor and a ground.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
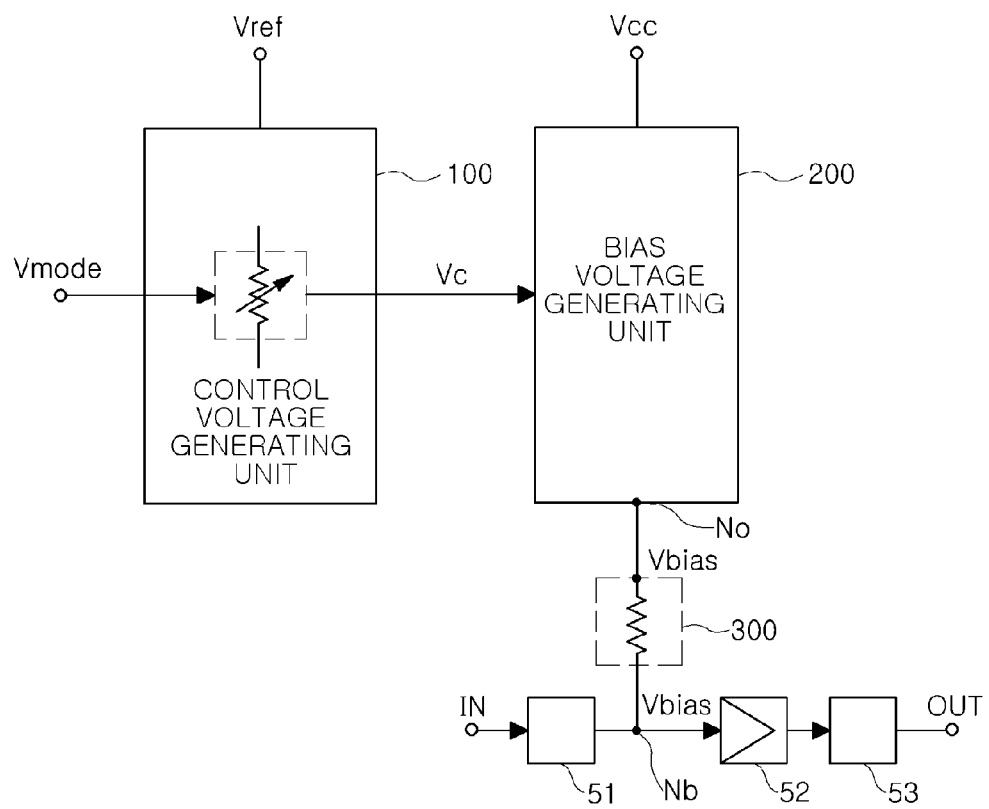
FIG. 1 is a block diagram of a bias circuit and an amplifier according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 2:
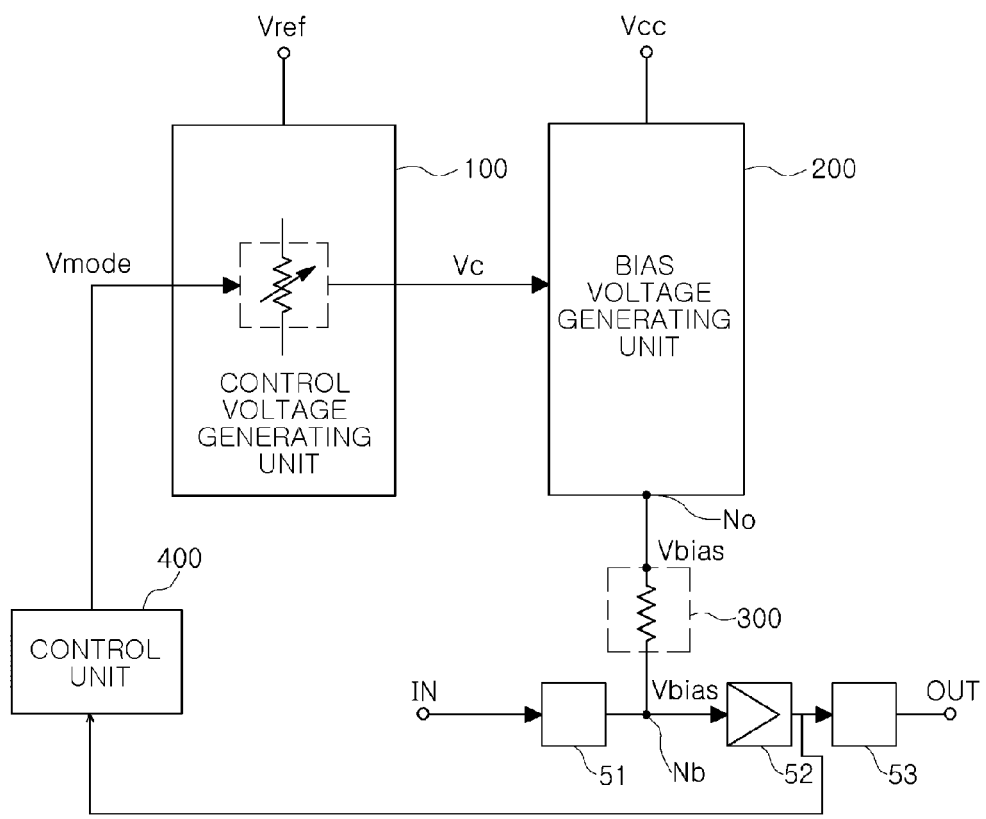
FIG. 2 is a block diagram of a bias circuit and an amplifier according to another embodiment of the present invention.

FIG. 1 is a block diagram of a bias circuit and an amplifier according to an embodiment of the present invention. FIG. 2 is a block diagram of a bias circuit and an amplifier according to another embodiment of the present invention.

Referring to FIG. 1, the bias circuit and the amplifier according to the embodiment of the present invention may include a control voltage generating unit 100, a bias voltage generating unit 200, and a voltage drop unit 300.

Referring to FIG. 2, the bias circuit and the amplifier according to another embodiment of the present invention may include the control voltage generating unit 100, the bias voltage generating unit 200, the voltage drop unit 300, and a control unit 400.

In addition, referring to FIGS. 1 and 2, the amplifier according to the embodiments of the present invention may further include an amplifying unit 52 amplifying a high-frequency signal, an input matching unit 51 connected to an input terminal of the amplifying unit 52, and an output matching unit 53 connected to an output terminal of the amplifying unit 52.

The control voltage generating unit 100 may generate a control voltage Vc using a reference voltage Vref. For example, when the reference voltage Vref is 2.9 V, the control voltage Vc may be 2.6 V.

Here, the control voltage generating unit 100 may control the control voltage Vc depending on the amplitude of a high-frequency signal input to the amplifying unit 52.

The bias voltage generating unit 200 may generate a bias voltage Vbias according to the control voltage Vc. For example, due to the operation of a transistor included in the bias voltage generating unit 200, when the control voltage Vc supplied to a base of the transistor increases, the bias voltage Vbias increases accordingly, and when the control voltage Vc decreases, the bias voltage Vbias decreases accordingly.

The voltage drop unit 300 may drop the bias voltage Vbias from the bias voltage generating unit 200 to a base voltage Vbase so as to provide the base voltage Vbase to the amplifying unit 52.

For instance, the voltage drop unit 300 may include a resistor connected between an output node No of the bias voltage generating unit 200 and an input node Nb of the amplifying unit 52.

Then, the amplifying unit 52 may receive the base voltage Vbase from the voltage drop unit 300 so as to amplify the power of the high-frequency signal.

Here, the input matching unit 51 performs impedance matching in the input terminal of the amplifying unit 52, such that a high-frequency signal via an input terminal IN is transmitted to the amplifying unit 52 without loss thereof. Likewise, the output matching unit 53 performs impedance matching in the output terminal of the amplifying unit 52, such that a signal output from the amplifying unit 52 is transmitted to an output terminal OUT without loss thereof.

The control unit 400 may determine a mode voltage Vmode depending on the amplitude of a high-frequency signal output from the amplifying unit 52 so as to provide it to the control voltage generating unit 100.

In particular, the control voltage generating unit 100 may include a variable resistance circuit having a resistance value varied depending on the mode voltage Vmode determined according to the amplitude of the high-frequency signal. Here, the variable resistance circuit may control the control voltage Vc according to the varied resistance value.

Now, the bias circuit and the amplifier including the control voltage generating unit 100 will be described with reference to FIGS. 3 to 5.

Figure 3:
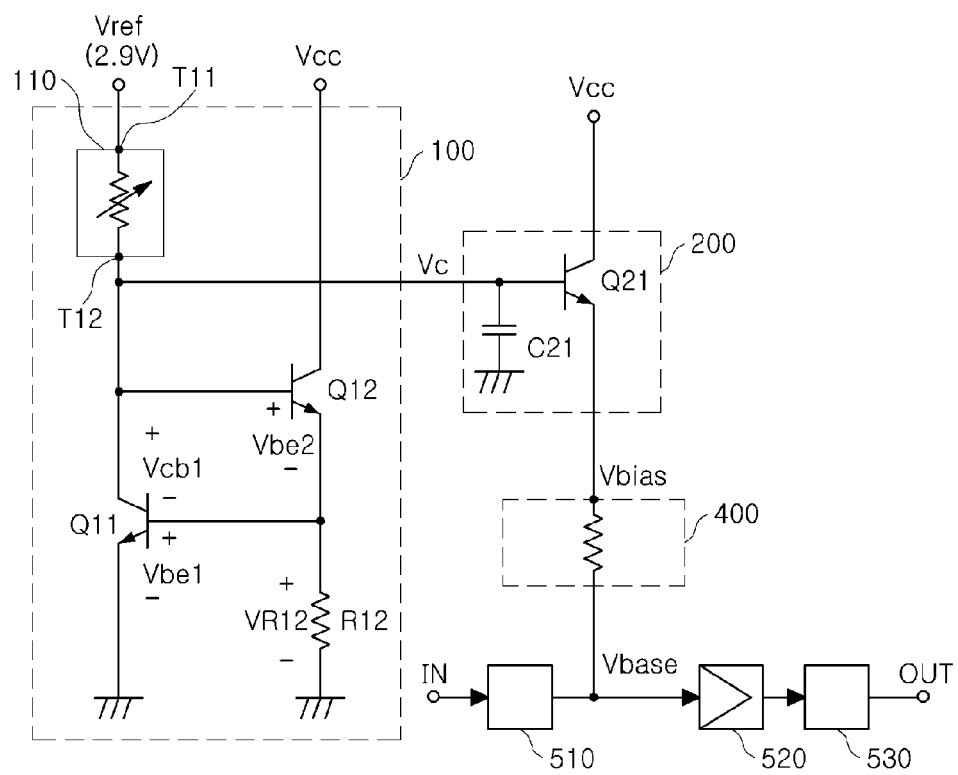
FIG. 3 is a circuit diagram illustrating an implementation example of the bias circuit and the amplifier according to the embodiment of the present invention.

FIG. 3 is a circuit diagram illustrating an implementation example of the bias circuit and the amplifier according to the embodiment of the present invention.

Referring to FIG. 3, the control voltage generating unit 100 may include a variable collector resistor circuit unit 110 having one terminal T11 connected to the input terminal of the reference voltage Vref and the other terminal T12. The variable collector resistor circuit unit 110 may have a resistance value varied depending on the mode voltage Vmode determined according to the amplitude of the high-frequency signal.

Further, the control voltage generating unit 100 may include a first temperature compensating transistor Q11 having a collector connected to the other terminal T12 of the variable collector resistor circuit unit 110 and an emitter and a base connected to a ground; and a second temperature compensation transistor Q12 having a collector connected to an input terminal of an operating voltage Vcc, a base connected to the collector of the first temperature compensation transistor Q11 and an emitter connected to the base of the first temperature compensation transistor Q11; and an emitter resistor R12 connected between the emitter of the second temperature compensation transistor Q12 and the ground.

In this configuration, in accordance with the varied resistance value of the variable collector resistor circuit unit 110, the control voltage Vc output from the collector of the first temperature compensation transistor Q11 may be controlled.

Here, a base-emitter voltage Vbe1 of the first temperature compensating transistor Q11 is equal to the voltage VR12 across the emitter resistor R12, and a collector-base voltage Vcb1 of the first temperature compensation transistor Q11 is equal to a base-emitter voltage Vbe2 of the second temperature compensation transistor Q12.

The control voltage Vc output from the collector of the first temperature compensating transistor Q11 is equal to the sum of the collector-base voltage Vcb1 and the base-emitter voltage Vbe1 of the first temperature compensation transistor Q11, and is equal to the sum of the base-emitter voltage Vb2 of the second temperature compensation transistor Q12 and the voltage VR12 across the emitter resistor R12.

Figure 4:
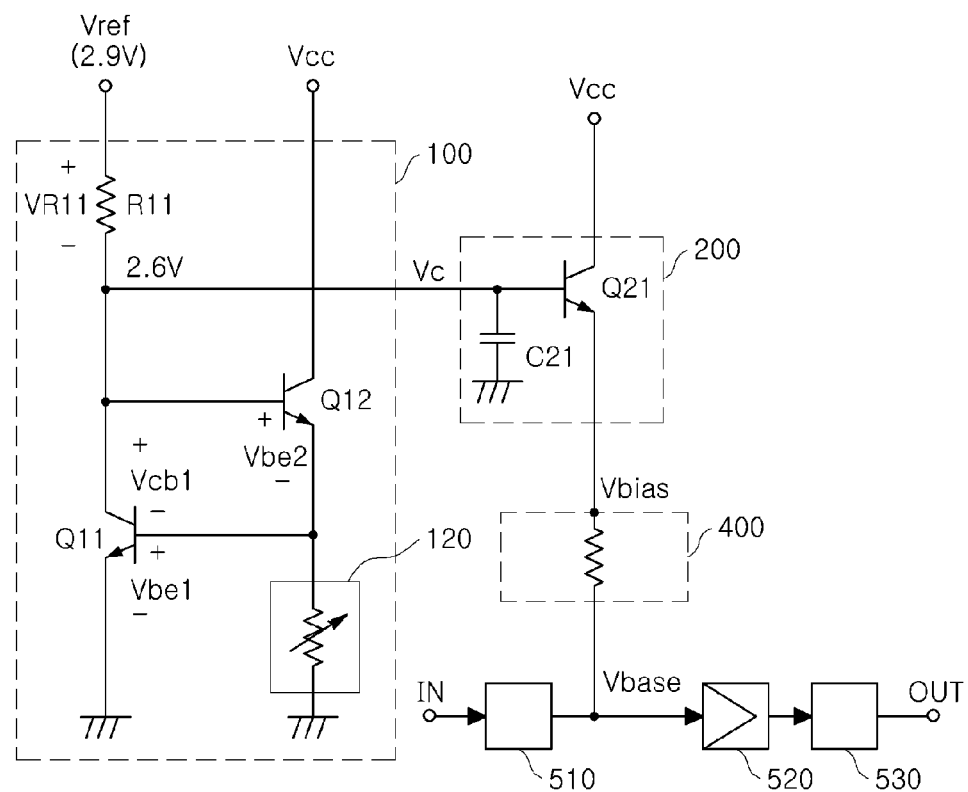
FIG. 4 is a circuit diagram illustrating another implementation example of the bias circuit and the amplifier according to the embodiment of the present invention.

FIG. 4 is a circuit diagram illustrating another implementation example of the bias circuit and the amplifier according to the embodiment of the present invention.

Referring to FIG. 4, the control voltage generating unit 100 may include a collector resistor R11 having one terminal T11 connected to the input terminal of the reference voltage Vref and the other terminal T12; a first temperature compensating transistor Q11 having a collector connected to the other terminal T12 of the collector resistor R11 and an emitter and a base connected to a ground; and a second temperature compensation transistor Q12 having a collector connected to an input terminal of an operating voltage Vcc, a base connected to the collector of the first temperature compensation transistor Q11 and an emitter connected to the base of the first temperature compensation transistor Q11.

Further, the control voltage generating unit 100 may include a variable emitter resistor circuit unit 120, which is connected between the emitter of the second temperature compensation transistor Q12 and a ground and has a resistance value varied depending on the mode voltage Vmode determined according to the amplitude of the high-frequency signal.

In this configuration, in accordance with the varied resistance value of the variable emitter resistor circuit unit 120, the control voltage Vc output from the collector of the first temperature compensation transistor Q11 may be controlled.

Figure 5:
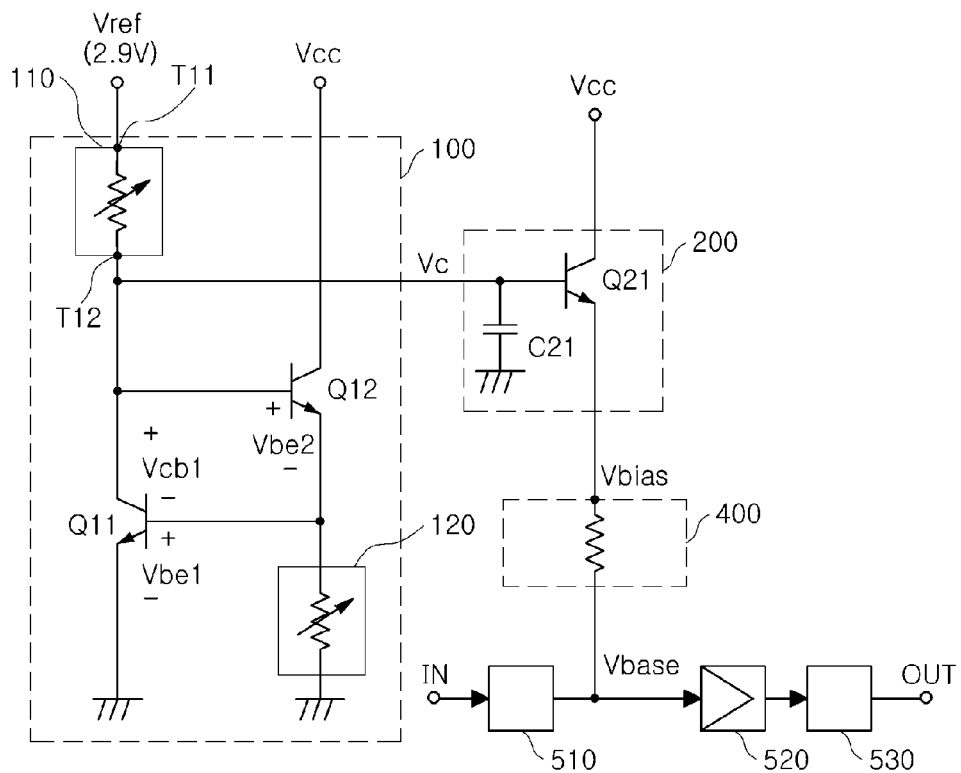
FIG. 5 is a circuit diagram illustrating another implementation example of the bias circuit and the amplifier according to the embodiment of the present invention.

FIG. 5 is a circuit diagram illustrating another implementation example of the bias circuit and the amplifier according to the embodiment of the present invention.

Referring to FIG. 5, the control voltage generating unit 100 may include a variable collector resistor circuit unit 110 having one terminal T11 connected to an input terminal of the reference voltage Vref and the other terminal T12. The variable collector resistor circuit unit 110 may have a resistance value varied depending on the mode voltage Vmode determined according to the amplitude of the high-frequency signal.

Further, the control voltage generating unit 100 may include a first temperature compensating transistor Q11 having a collector connected to the other terminal T12 of the collector resistor R11 and an emitter and a base connected to a ground; and a second temperature compensation transistor Q12 having a collector connected to an input terminal of an operating voltage Vcc, a base connected to the collector of the first temperature compensation transistor Q11 and an emitter connected to the base of the first temperature compensation transistor Q11.

Further, the control voltage generating unit 100 may include a variable emitter resistor circuit unit 120 connected between the emitter of the second temperature compensation transistor Q12 and the ground. The variable emitter resistor circuit unit 120 may have a resistance value varied depending on the mode voltage Vmode determined according to the amplitude of the high-frequency signal.

In this configuration, in accordance with the varied resistance values of the variable collector resistor circuit unit 110 and the emitter resistor circuit unit 120, the control voltage Vc output from the collector of the first temperature compensation transistor Q11 may be controlled.

Referring to FIGS. 4 and 5, the base-emitter voltage Vbe1 of the first temperature compensating transistor Q11 is equal to the voltage VR12 across the emitter resistor R12, and the collector-base voltage Vcb1 of the first temperature compensation transistor Q11 is equal to the base-emitter voltage Vbe2 of the second temperature compensation transistor Q12.

The control voltage Vc output from the collector of the first temperature compensating transistor Q11 is equal to the sum of the collector-base voltage Vcb1 and the base-emitter voltage Vbe1 of the first temperature compensation transistor Q11, and is equal to the sum of the base-emitter voltage Vbe2 of the second temperature compensation transistor Q12 and the voltage VR12 across the variable emitter resistor circuit unit 120.

In addition, the bias voltage generating unit 200 may include a bias supplying transistor Q21 having a collector connected to the input terminal of the operating voltage Vcc, a base connected to the collector of the first temperature compensating transistor Q11 and an emitter connected to the output node of the bias voltage generating unit 200; and a capacitor C21 connected between the base of the bias supplying transistor Q21 and a ground.

Here, the bias supplying transistor Q21 allows an amount of the current proportional to the amplitude of the control voltage Vc to flow between the collector and the emitter of the bias supplying transistor Q21.

Subsequently, the current flowing between the collector and the emitter of the bias supplying transistor Q21 flows through the voltage drop unit 300 and in this case, voltage drop occurs in the voltage drop unit 300. Here, the voltage drop unit 300 may include a resistor.

Figure 6:
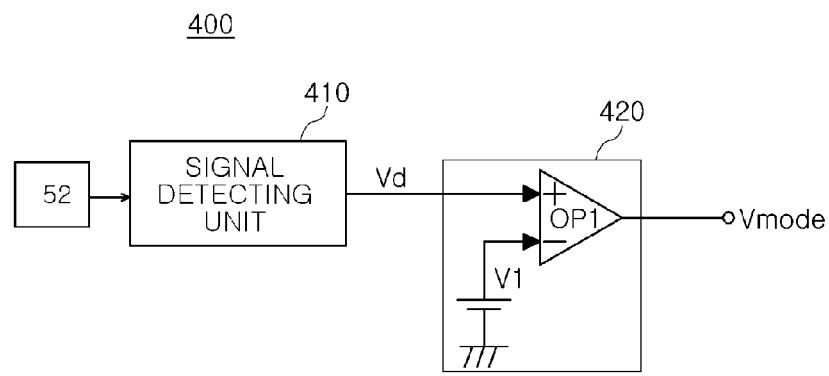
FIG. 6 is a diagram illustrating an implementation example of a control unit according to the embodiment of the present invention.

FIG. 6 is a diagram illustrating an implementation example of a control unit according to the embodiment of the present invention.

Referring to FIG. 6, the control unit 400 may include a signal detecting unit 410 and a comparator unit 420.

The signal detecting unit 410 may detect a voltage of the amplitude of a high-frequency signal output from the amplifying unit 52 so as to provide the detected voltage Vd to the comparator unit 420.

The comparator 420 may compare the detected voltage Vd with a comparison reference voltage V1 so as to output the mode voltage Vmode based on the result.

Here, the comparator unit may include an operational amplifier OP1 having a non-inverting input terminal to which the detected voltage Vd is input and an inverting input terminal to which the comparison reference voltage V1 is input. Here, the comparison reference voltage V1 may set to the voltage at which average output power of a high-frequency signal is 14 dB.

For example, the comparator unit 420 may output the mode voltage Vmode having a low level when the input high-frequency signal has an amplitude smaller than a normal amplitude. Alternatively, the comparator unit 420 may output the mode voltage Vmode having a high level when the input high-frequency signal has an amplitude greater than normal amplitude.

Figure 7:
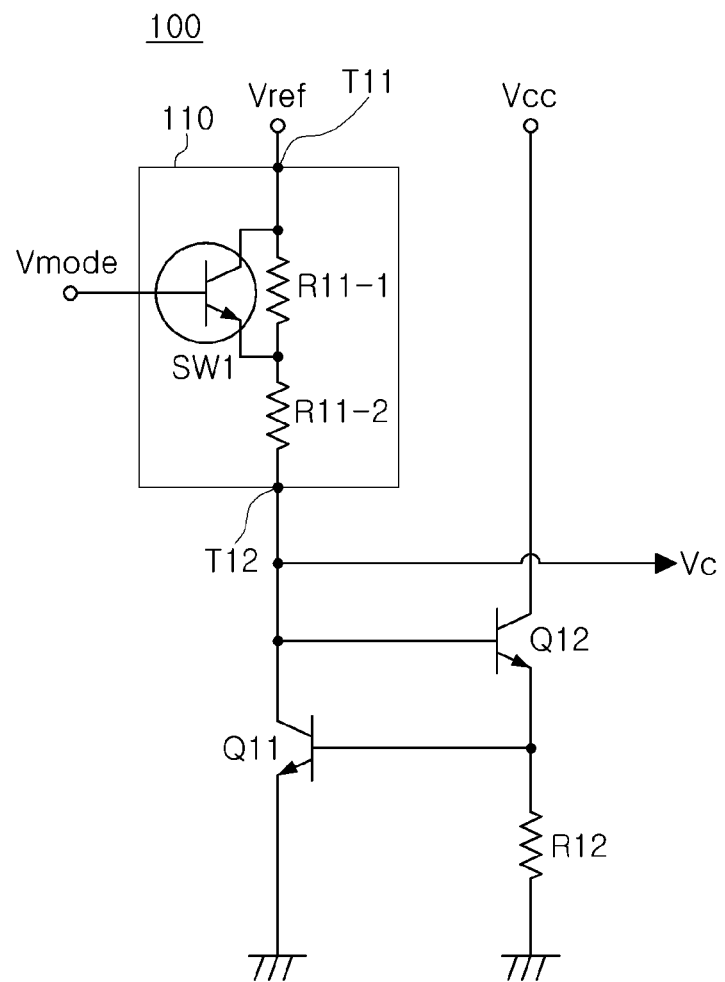
FIG. 7 is a circuit diagram illustrating an implementation example of a control voltage generating unit according to the embodiment of the present invention.
Figure 8:
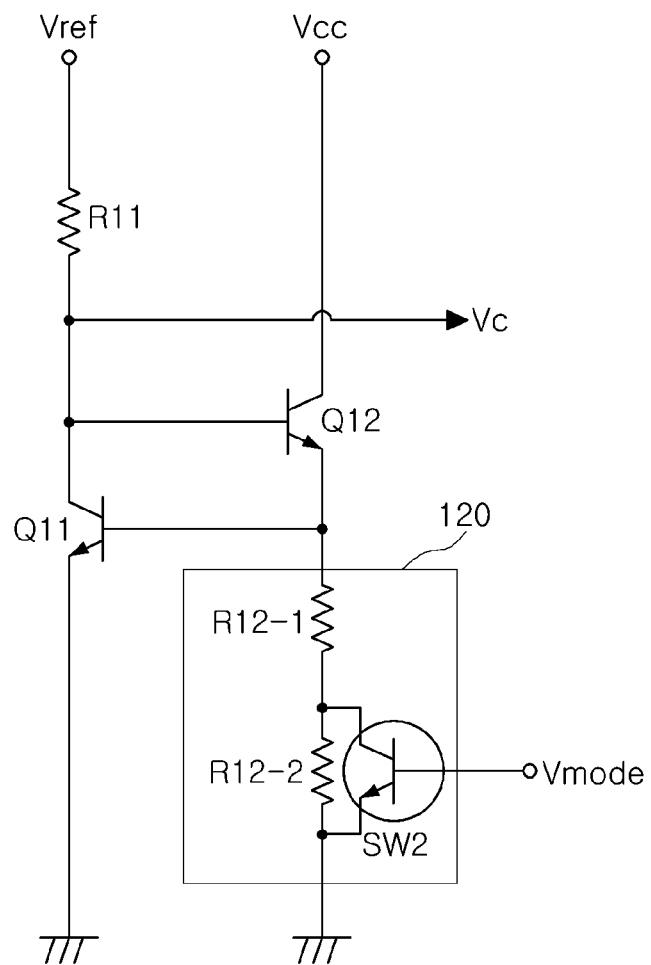
FIG. 8 is a circuit diagram illustrating another implementation example of the control voltage generating unit according to the embodiment of the present invention.
Figure 9:
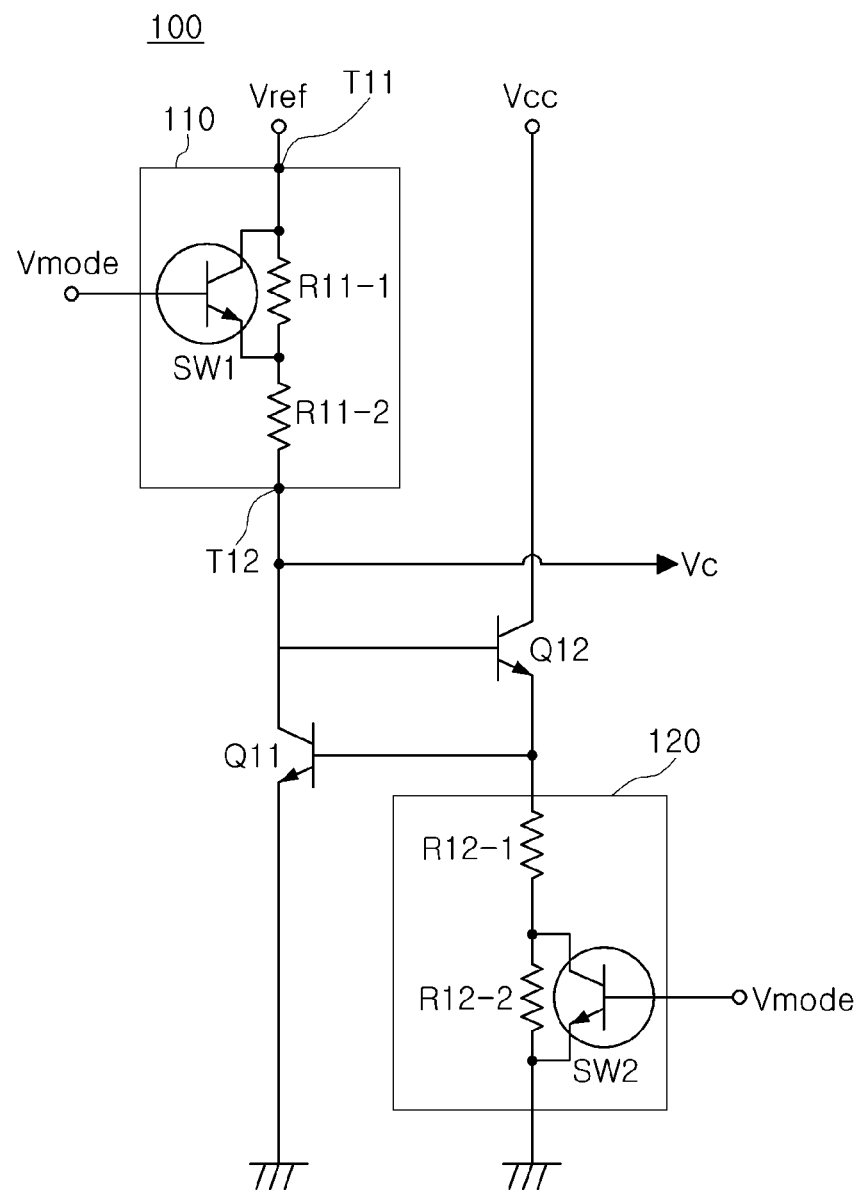
FIG. 9 is a circuit diagram illustrating another implementation example of the control voltage generating unit according to the embodiment of the present invention.

FIG. 7 is a circuit diagram illustrating an implementation example of a control voltage generating unit according to the embodiment of the present invention. FIG. 8 is a circuit diagram illustrating another implementation example of the control voltage generating unit according to the embodiment of the present invention. FIG. 9 is a circuit diagram illustrating another implementation example of the control voltage generating unit according to the embodiment of the present invention.

The variable collector resistor circuit unit 110 may include a plurality of resistors R11-1 and R11-2 connected in series between the one terminal T11 and the other terminal T12, and a first semiconductor switch element SW1 connected to at least one of the plurality of resistors R11-1 and R11-2 in parallel and turned on or off depending on the mode voltage Vmode.

Here, the variable collector resistor circuit unit 110 is not limited to the implementation example but may be variously implemented as a serial resistor circuit, a parallel resistor circuit or a combination of serial or parallel resistor circuit and a semiconductor switch element.

For example, when the variable collector resistor circuit unit 110 includes two resistors R11-1 and R11-2 connected in series between the one terminal T11 and the other terminal T12 as shown in FIGS. 7 and 9, the first semiconductor switch element SW1 may be connected to the resistor R11-1 in parallel. Here, the first semiconductor switch element SW1 may include a transistor having a base to which the mode voltage Vmode is input and a collector and an emitter connected to both terminals of the resistor R11-1, respectively.

When a high-frequency signal input thereto is smaller than normal amplitude, if the mode voltage Vmode is in a low level, then the first semiconductor switch element SW1 is turned off according to the mode voltage Vmode at the low level, such that the voltage dropped across two resistors R11-1 and R11-2 is increased and thus the control voltage Vc is decreased.

Alternatively, when a high-frequency signal input thereto is greater than normal amplitude, if the mode voltage Vmode is in a high level, then the first semiconductor switch element SW1 is turned on according to the mode voltage Vmode at the high level, such that the voltage dropped across one resistor R11-2 is decreased and thus the control voltage Vc is increased.

The variable emitter resistor circuit unit 120 may include a plurality of resistors connected in series between the emitter of the second temperature compensation transistor Q12 and a ground, and a second semiconductor switch element connected to at least one of the plurality of resistors in parallel and turned on or off depending on the mode voltage Vmode.

Here, the variable emitter resistor circuit unit 120 is not limited to the implementation example but may be variously implemented as a serial resistor circuit, a parallel resistor circuit or a combination of serial or parallel resistor circuit and a semiconductor switch element.

For example, when the variable collector resistor circuit unit 120 includes two resistors R12-1 and R12-2 connected in series between the emitter of the second temperature compensation transistor Q12 and a ground as shown in FIGS. 8 and 9, the second semiconductor switch element SW2 may be connected to the resistor R12-2 in parallel. Here, the second semiconductor switch element SW2 may include a transistor having a base to which the mode voltage Vmode is input and a collector and an emitter connected to both terminals of the resistor R12-2, respectively.

When a high-frequency signal input thereto is smaller than normal amplitude, if the mode voltage Vmode is in a low level, then the semiconductor switch element SW2 is turned off according to the mode voltage Vmode at the low level, such that the voltage dropped across two resistors R11-1 and R11-2 is increased, and the base-emitter voltage Vbe2 of the second temperature compensation transistor Q12 is decreased and thus the control voltage Vc is decreased.

Alternatively, when a high-frequency signal input thereto is greater than normal amplitude, if the mode voltage Vmode is in a high level, then the first semiconductor switch element SW1 is turned on according to the mode voltage Vmode at the high level, such that the voltage dropped across one resistor R11-2 is decreased, and the base-emitter voltage Vbe2 of the second temperature compensation transistor Q12 is increased and thus the control voltage Vc is increased.

Figure 10:
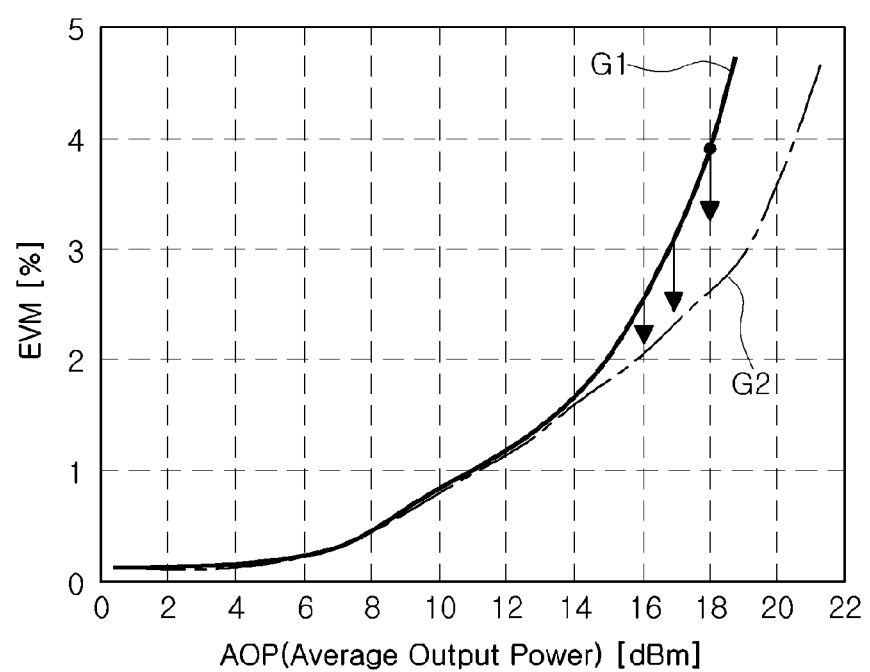
FIG. 10 is a graph showing an EVM to average output power characteristics of the amplifier according to the embodiment of the present invention.

FIG. 10 is a graph showing an EVM to average output power characteristics of the amplifier according to the embodiment of the present invention.

Referring to FIG. 10, in the power amplifier according to the embodiment of the present invention, the bias circuit unit 300 operates differently depending on the amplitude of an input signal, thereby facilitating the optimization.

The linearity of a linear power amplifier may be evaluated with EVM (%) characteristics, and as EVM (%) is lowered, the linearity of a linear power amplifier may be improved. Referring to FIG. 10, compared to the characteristics graph G1 according to the related art, the characteristics graph G2 according to the embodiment of the present invention is generally improved, and, especially, EVM characteristics of the power amplifier according to the embodiment of the present invention is significantly improved in terms of low power (below 14 dB).

As set forth above, according to embodiments of the present invention, bias voltage can be controlled according to the amplitude of a high-frequency signal input thereto. Accordingly, when a high-frequency signal having a relatively large amplitude is input, the bias voltage is increased so that the high-frequency signal can be amplified without distortion.

While the present invention has been shown and described in connection with the embodiments, it will be apparent to those skilled in the art that modifications and variations can be made without departing from the spirit and scope of the invention as defined by the appended claims.

What is claimed is:

1. A bias circuit, comprising:
   a control voltage generating unit generating a control voltage using a reference voltage;
   a bias voltage generating unit generating a bias voltage according to the control voltage; and
   a voltage drop unit dropping the bias voltage from the bias voltage generating unit to a base voltage so as to provide the base voltage to an amplifying unit,
   wherein the control voltage generating unit controls the control voltage according to an amplitude of a high-frequency signal input to the amplifying unit,
   wherein the control voltage generating unit includes:
      a variable collector resistor circuit unit having one terminal connected to an input terminal of the reference voltage and the other terminal, and having a resistance value varied depending on a mode voltage determined according to the amplitude of the high-frequency signal;
      a first temperature compensation transistor having a collector connected to the other terminal of the variable collector resistor circuit unit and an emitter and a base connected to a ground;
      a second temperature compensation transistor having a collector connected to an input terminal of an operating voltage, a base connected to the collector of the first temperature compensation transistor, and an emitter connected to the base of the first temperature compensation transistor; and an emitter resistor connected between the emitter of the second temperature compensation transistor and the ground, and the control voltage output from the collector of the first temperature compensation transistor is controlled according to the resistance value varied in the variable collector resistor circuit unit.

2. A bias circuit, comprising:

a control voltage generating unit generating a control voltage using a reference voltage;

a bias voltage generating unit generating a bias voltage according to the control voltage; and a voltage drop unit dropping the bias voltage from the bias voltage generating unit to a base voltage so as to provide the base voltage to an amplifying unit, wherein the control voltage generating unit includes:

a collector resistor having one terminal connected to an input terminal of the reference voltage and the other terminal;

a first temperature compensation transistor having a collector connected to the other terminal of the collector resistor and an emitter and a base connected to a ground;

a second temperature compensation transistor having a collector connected to an input terminal of an operating voltage, a base connected to the collector of the first temperature compensation transistor, and an emitter connected to the base of the first temperature compensation transistor; and a variable emitter resistor circuit unit connected between the emitter of the second temperature compensation transistor and the ground, and having a resistance value varied depending on a mode voltage determined according to the amplitude of the high-frequency signal, and the control voltage output from the collector of the first temperature compensation transistor is controlled according to the resistance value varied in the variable emitter resistor circuit unit.

3. A bias circuit comprising:

a control voltage generating unit generating a control voltage using a reference voltage;

a bias voltage generating unit generating a bias voltage according to the control voltage; and a voltage drop unit dropping the bias voltage from the bias voltage generating unit to a base voltage so as to provide the base voltage to an amplifying unit, wherein the control voltage generating unit controls the control voltage according to an amplitude of a high-frequency signal input to the amplifying unit, wherein the control voltage generating unit includes:

a variable collector resistor circuit unit having one terminal connected to an input terminal of the reference voltage and the other terminal, and having a resistance value varied depending on a mode voltage determined according to the amplitude of the high-frequency signal;

a first temperature compensation transistor having a collector connected to the other terminal of the variable collector resistor circuit unit and an emitter and a base connected to a ground;

a second temperature compensation transistor having a collector connected to an input terminal of an operating voltage, a base connected to the collector of the first temperature compensation transistor, and an emitter connected to the base of the first temperature compensation transistor; and a variable emitter resistor circuit unit connected between the emitter of the second temperature compensation transistor and the ground, and having a resistance value varied depending on a mode voltage determined according to the amplitude of the high-frequency signal, and the control voltage output from the collector of the first temperature compensation transistor is controlled according to the resistance value varied in each of the variable collector resistor circuit unit and the variable emitter resistor circuit unit.

4. The bias circuit of claim 3, wherein the variable collector resistor circuit unit includes:

a plurality of resistors connected in series between the one terminal and the other terminal thereof; and a first semiconductor switch element connected to at least one of the plurality of resistors in parallel and turned on or off depending on the mode voltage.

5. The bias circuit of claim 3, wherein the variable emitter resistor circuit unit includes:

a plurality of resistors connected in series between the emitter of the second temperature compensation transistor and the ground; and a second semiconductor switch element connected to at least one of the plurality of resistors in parallel and turned on or off depending on the mode voltage.

6. The circuit of claim 3, wherein the bias voltage generating unit includes:

a bias supplying transistor having a collector connected to an input terminal of an operating voltage, a base connected to the collector of the first temperature compensating transistor, and an emitter connected to an output node of the bias voltage generating unit; and a capacitor connected between the base of the bias supplying transistor and a ground.

7. An amplifier, comprising:

an amplifying unit amplifying a high-frequency signal;

a control voltage generating unit generating a control voltage using a reference voltage, the control voltage being controlled depending on a mode voltage;

a bias voltage generating unit generating a bias voltage according to the control voltage;

a voltage drop unit dropping the bias voltage from the bias voltage generating unit to a base voltage so as to provide the base voltage to the amplifying unit; and a control unit determining the mode voltage according to the amplitude of the high-frequency signal so as to provide the mode voltage to the control voltage generating unit, wherein the control voltage generating unit includes:

a variable collector resistor circuit unit having one terminal connected to an input terminal of the reference voltage and the other terminal, and having a resistance value varied depending on the mode voltage;

a first temperature compensation transistor having a collector connected to the other terminal of the variable collector resistor circuit unit and an emitter and a base connected to a ground;

a second temperature compensation transistor having a collector connected to an input terminal of an operating voltage, a base connected to the collector of the first temperature compensation transistor, and an emitter connected to the base of the first temperature compensation transistor; and an emitter resistor connected between the emitter of the second temperature compensation transistor and the ground, and the control voltage output from the collector of the first temperature compensation transistor is controlled according to the resistance value varied in the variable collector resistor circuit unit.

8. An amplifier comprising:
an amplifying unit amplifying a high-frequency signal;
a control voltage generating unit generating a control voltage using a reference voltage, the control voltage being controlled depending on a mode voltage;
a bias voltage generating unit generating a bias voltage according to the control voltage;
a voltage drop unit dropping the bias voltage from the bias voltage generating unit to a base voltage so as to provide the base voltage to the amplifying unit; and
a control unit determining the mode voltage according to the amplitude of the high-frequency signal so as to provide the mode voltage to the control voltage generating unit,
wherein the control voltage generating unit includes:
a collector resistor having one terminal connected to an input terminal of the reference voltage and the other terminal;
a first temperature compensation transistor having a collector connected to the other terminal of the collector resistor and an emitter and a base connected to a ground;
a second temperature compensation transistor having a collector connected to an input terminal of an operating voltage, a base connected to the collector of the first temperature compensation transistor, and an emitter connected to the base of the first temperature compensation transistor; and
a variable emitter resistor circuit unit connected between the emitter of the second temperature compensation transistor and the ground, and having a resistance value varied depending on the mode voltage, and
the control voltage output from the collector of the first temperature compensation transistor is controlled according to the resistance value varied in the variable emitter resistor circuit unit.

9. An amplifier comprising:
an amplifying unit amplifying a high-frequency signal;
a control voltage generating unit generating a control voltage using a reference voltage, the control voltage being controlled depending on a mode voltage;
a bias voltage generating unit generating a bias voltage according to the control voltage;
a voltage drop unit dropping the bias voltage from the bias voltage generating unit to a base voltage so as to provide the base voltage to the amplifying unit; and
a control unit determining the mode voltage according to the amplitude of the high-frequency signal so as to provide the mode voltage to the control voltage generating unit,
wherein the control voltage generating unit includes:
a variable collector resistor circuit unit having one terminal connected to an input terminal of the reference voltage and the other terminal, and having a resistance value varied depending on a mode voltage;
a first temperature compensation transistor having a collector connected to the other terminal of the variable collector resistor circuit unit and an emitter and a base connected to a ground;

a second temperature compensation transistor having a collector connected to an input terminal of an operating voltage, a base connected to the collector of the first temperature compensation transistor, and an emitter connected to the base of the first temperature compensation transistor; and
a variable emitter resistor circuit unit connected between the emitter of the second temperature compensation transistor and the ground, and having a resistance value varied depending on the mode voltage, and
the control voltage output from the collector of the first temperature compensation transistor is controlled according to the resistance value varied in each of the variable collector resistor circuit unit and in the variable emitter resistor circuit unit.

10. The amplifier of claim 9, wherein the variable collector resistor circuit unit includes:
a plurality of resistors connected in series between the one terminal and the other terminal thereof; and
a first semiconductor switch element connected to at least one of the plurality of resistors in parallel and turned on or off depending on the mode voltage.

11. The amplifier circuit of claim 9, wherein the variable emitter resistor circuit unit includes:
a plurality of resistors connected in series between the emitter of the second temperature compensation transistor and the ground; and
a second semiconductor switch element connected to at least one of the plurality of resistors in parallel and turned on or off depending on the mode voltage.

12. The amplifier of claim 9, wherein the bias voltage generating unit includes:
a bias supplying transistor having a collector connected to an input terminal of an operating voltage, a base connected to the collector of the first temperature compensating transistor, and an emitter connected to an output node of the bias voltage generating unit; and
a capacitor connected between the base of the bias supplying transistor and a ground.

13. An amplifier comprising:
an amplifying unit amplifying a high-frequency signal;
a control voltage generating unit generating a control voltage using a reference voltage, the control voltage being controlled depending on a mode voltage;
a bias voltage generating unit generating a bias voltage according to the control voltage;
a voltage drop unit dropping the bias voltage from the bias voltage generating unit to a base voltage so as to provide the base voltage to the amplifying unit; and
a control unit determining the mode voltage according to the amplitude of the high-frequency signal so as to provide the mode voltage to the control voltage generating unit,
wherein the control unit includes:
a signal detecting unit detecting a voltage of the amplitude of the high-frequency signal output from the amplifying unit so as to provide the detected voltage; and
a comparator unit comparing the detected voltage with a comparison reference voltage and outputting the mode voltage based on the comparison result.

* * * * *